United States Patent
Bailey et al.

(10) Patent No.: US 10,656,208 B2
(45) Date of Patent: May 19, 2020

(54) METHOD OF ASSESSING THE RISK OF A STATOR FAILURE

(71) Applicant: Siemens Energy, Inc., Orlando, FL (US)

(72) Inventors: Kevin P. Bailey, Chuluota, FL (US); Randy Edward Whitener, Oviedo, FL (US)

(73) Assignee: SIEMENS ENERGY, INC., Orlando, FL (US)

( * ) Notice: Subject to any disclaimer, the term of this patent is extended or adjusted under 35 U.S.C. 154(b) by 60 days.

(21) Appl. No.: 15/977,539

(22) Filed: May 11, 2018

(65) Prior Publication Data
US 2019/0285697 A1    Sep. 19, 2019

Related U.S. Application Data

(63) Continuation-in-part of application No. 15/924,540, filed on Mar. 19, 2018, now abandoned.

(51) Int. Cl.
*G01R 31/34* (2020.01)
*H02K 3/04* (2006.01)

(52) U.S. Cl.
CPC .............. *G01R 31/343* (2013.01); *H02K 3/04* (2013.01)

(58) Field of Classification Search
CPC .... G01R 31/343; G01R 31/06; G01R 31/346; G01R 31/025; G01R 31/34; G01R 31/027; H02K 3/04
See application file for complete search history.

(56) References Cited

U.S. PATENT DOCUMENTS

2011/0191034 A1* 8/2011 Lee .................. G01R 31/343
702/35

FOREIGN PATENT DOCUMENTS

| JP | S56132550 A | 10/1981 |
| JP | H1155908 A | 2/1999 |
| JP | 2010223883 A | 10/2010 |
| JP | 2014215099 A | 11/2014 |
| KR | 20060048782 A | 5/2006 |

OTHER PUBLICATIONS

G. W. Stupian et al., "Advances in Microfocus Radiography and X-ray Computed Tomography", Microelectronics Reliability and Quality Workshop, Physical Sciences Laboratories, Electronics and Photonics Laboratory, The Aerospace Corporation, 2012, pp. 1-36.
Tri Van Tran, "Operational Faults in Large Synchronous Generators", University of South Australia, School of Electrical and Information Engineering, Aug. 25, 2006, pp. 1-270.
A. Contin et al., "Analysis of 3D Computed Tomograpic Imaging of Ground-wall Insulation for AC Rotating Machines" IEEE Transact ions on Dielectrics and Electrical Insulation, vol. 22, No. 3, Jun. 2015, pp. 1520-1529.
PCT International Search Report and Written Opinion dated Feb. 22, 2019 corresponding to PCT Application No. PCT/US2018/051937 filed Sep. 20, 2018.

* cited by examiner

*Primary Examiner* — Jermele M Hollington
*Assistant Examiner* — Suresh K Rajaputra

(57) ABSTRACT

A method of determining the risk of a stator failure is provided. The stator includes multiple stator coil windings. Each of the windings includes multiple conductive metal strands. The number of strand failures is determined from an image captured by a radiography. A risk analysis is assessed from the determined number of strand failures.

20 Claims, 2 Drawing Sheets

View II-II

METHOD OF ASSESSING THE RISK OF A STATOR FAILURE

FIELD OF THE INVENTION

The present disclosure is directed, in general, to the power generation industry, and more particularly to the field of generator stator coils.

BACKGROUND

In the power generation industry, power generators include high voltage generator stator coil windings. Each winding comprises a plurality of conductive metal strands, each of which may be insulated by a coating. Due to one or more conditions, a strand may have a failure, such as a crack or a break. A crack being a split in the strand without the strand being separate parts whereas a break is when the strand is split into separate parts. Failure of strands can lead to a malfunction of the stator.

A method for detecting a failure of strands or of the winding is a voltage detection test (VDT), which involves conducting a current in a winding and measuring a voltage drop between two points on the winding. A voltage drop in a specified range can be indicative of a failure. The voltage drop may not be sufficient to detect a low number of failures, for example, in a single strand or possibly in a few strands. Additionally, a cracked or broken strand may be in electrical contact at the point of failure allowing current to pass through crack or break. In such a case, the failure would be undetected by the VDT. Furthermore, preparation of the VDT is time consuming drilling holes in the winding in order to conduct the test. In the case the VDT does not detect failure, any holes would be re-plugged after testing. It is possible that the plugs could create a point of future failure.

SUMMARY

Variously disclosed embodiments include methods and systems that may be used to facilitate the evaluating the risk of stator failures. In one example, a method of determining the risk of a stator failure is provided. The stator comprises a plurality of stator coil windings, the plurality of windings comprises a first winding, each of the windings comprises a plurality of conductive metal strands. According to the method the number of strand failures in the first winding is determined, from an image of at least a portion of the first winding within an inspection area, captured by a radiography. A number of strand failures is determined from an image of at least a portion of the winding within an inspection area. The image captured by radiography. A risk of the stator failure is analyzed by the number of strand failures and may be based on at least one stator characteristic Whereby the risk analysis is performed based on non-destructive testing results of capturing the image from the radiography and from stator characteristics.

The foregoing has outlined rather broadly the technical features of the present disclosure so that those skilled in the art may better understand the detailed description that follows. Additional features and advantages of the disclosure will be described hereinafter that form the subject of the claims. Those skilled in the art will appreciate that they may readily use the conception and the specific embodiments disclosed as a basis for modifying or designing other structures for carrying out the same purposes of the present disclosure. Those skilled in the art will also realize that such equivalent constructions do not depart from the spirit and scope of the disclosure in its broadest form.

Also, before undertaking the Detailed Description below, it should be understood that various definitions for certain words and phrases are provided throughout this patent document, and those of ordinary skill in the art will understand that such definitions apply in many, if not most, instances to prior as well as future uses of such defined words and phrases. While some terms may include a wide variety of embodiments, the appended claims may expressly limit these terms to specific embodiments.

BRIEF DESCRIPTION OF THE DRAWINGS

The embodiments of the invention are described more detail with help of figures. The figures show specific configurations and do not limit the scope of the invention.

DETAILED DESCRIPTION

Figure 1:
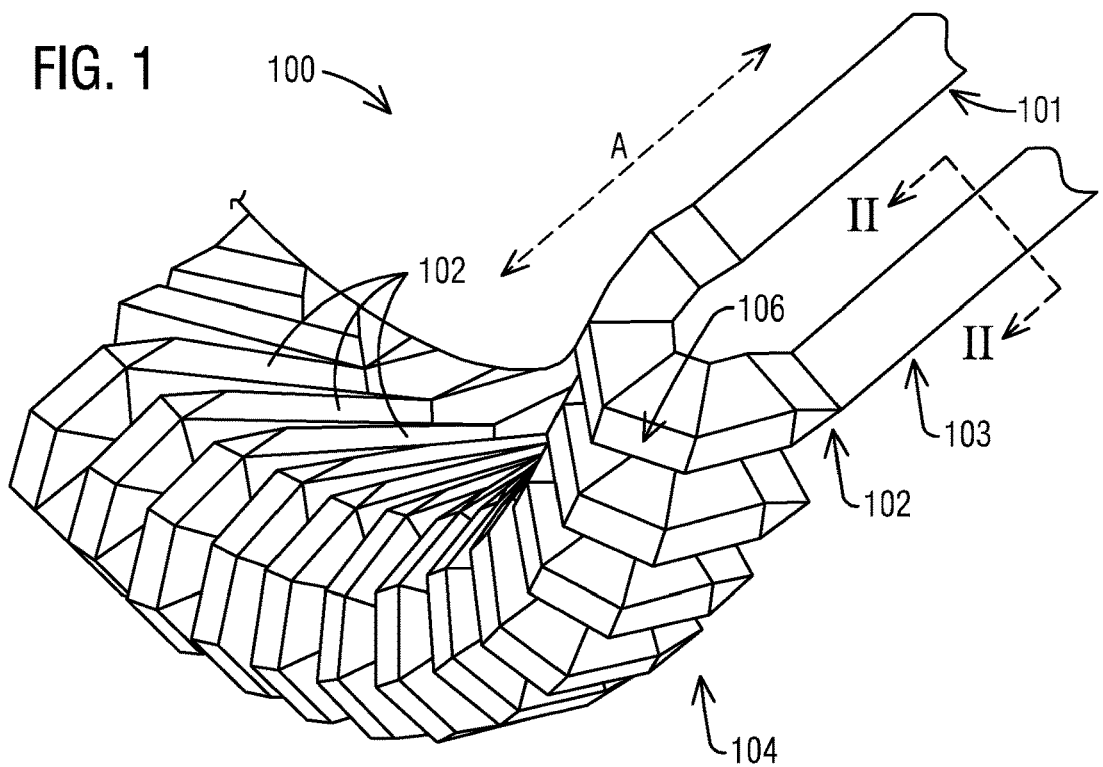
FIG. 1 illustrates perspective view of a portion of an example generator stator that facilitates accessing the risk of a stator failure.

Various technologies that pertain to methods and systems that facilitate assessing the risk of a stator failure will now be described with reference to the drawings, where like reference numerals represent like elements throughout. The drawings discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged apparatus. It is to be understood that functionality that is described as being carried out by certain system elements may be performed by multiple elements. Similarly, for instance, an element may be configured to perform functionality that is described as being carried out by multiple elements. The numerous innovative teachings of the present application will be described with reference to exemplary non-limiting embodiments.

FIG. 1 illustrates a perspective view of a portion of an example generator stator 100 that facilitates carrying out one or more of the embodiments described herein. The stator 100 comprises a plurality of stator coil windings 102. Each winding 102 includes an inner section 101 and an outer section 103, where the distance of the outer section 103 from the longitudinal axis A of the stator 100 is greater than the distance of inner section 101 from the longitudinal axis.

An end winding 104 is the part of the winding 102 located outside of the stator core. The end winding 104 extends axially from the stator core. At an end region 106 of the winding 102 the inner section 101 is coupled to an outer section 103 of the winding 102. An inspection area is an area in which an inspection via a radiography may be performed. This inspection area is any portion of the end winding 104. Any type of known radiography may be used to obtain an image.

Figure 2:
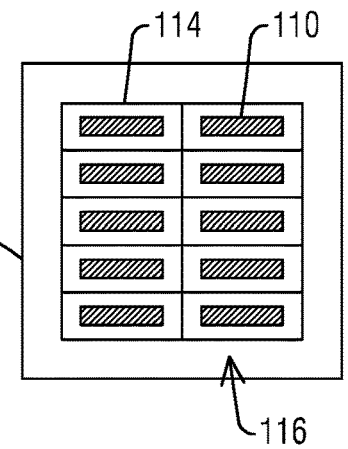
FIG. 2 is a cross section view of a winding.

FIG. 2 is a cross-section view of winding 102 along the section II in FIG. 1. The winding 102 comprises a plurality of conductive metal strands 110. Each of the strands 110 may be encased in a strand insulation 114. The winding 102 may be encased in a winding insulation 116. FIG. 2 is merely an illustrative example of a cross section of a winding 102.

Figure 3:
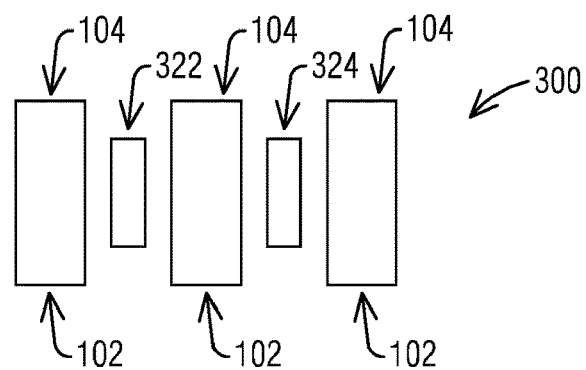
FIG. 3 illustrates a schematic diagram of a system that facilitates accessing the risk of a stator failure.

FIG. 3 illustrates a schematic diagram of a system 300 that facilitates carrying out one or more of the embodiments described herein. System 300 comprises a radiography, which comprises a radiation source 322 and an image capture device 324.

The radiation source 322 utilizes a form of electromagnetic radiation to travel through an object. In an embodiment, the radiation source 322 is sufficient to travel through insulation 114, 116 in the winding 102. In another embodiment, the radiation source 322 is sufficient to travel through the insulation 114, 116 and strand 110. In an embodiment, the radiation source 322 is sufficient to travel through the winding 102. An electromagnetic radiation may be used for the radiation source 322. For example, X-rays or gamma rays may be used for the radiation source 322. More specifically, X-ray, Radium, caesium-137, iridium-192 or cobalt-60 may be used as the radiation source 322.

The radiography is arranged in an inspection area of at least one of the windings 102, the radiation source 322 is directed towards the image capture device 324. The inspection area is within the end winding 104. For example, the inspection area is near a curved portion of the end winding 104. In another example, the inspection area is substantially near the end region 106. In an embodiment, the radiation source 322 is arranged on a first side of the end winding 104, between adjacent end windings 104, and the image capture device 324 is arranged on a second side of the end winding 104. Such an arrangement facilitates capturing an image of the portion of the end winding 104 residing between the radiation source 322 and the image capture device 324. Thereby, a non-destructive test of the winding is performed to obtain an image. The image effective to capture strand failures of the end winding 104.

In an embodiment, the image captures a portion of the entire width of an end winding 104. Consequently, not all the strands 110 in the end winding 104 are captured in the image. For example, a limitation of the size of radiation source 322 and/or image capture device 324 as compared to the width of the end winding 104 may prevent the image to capture the entire width. To remedy this, it is possible to take multiple images of the end winding 104, repositioning the radiation source 322 and the image capture device 324 per image, to produce a combined image of the end winding 104.

Alternatively, a single image may be taken when the inspection area is selected based on one or more stator characteristics. Stator characteristics are features of the winding 102. Stator characteristics may comprise the strand material, the dimensions of the strand, the layout of the strands in the winding 102, the number of strands in the winding 102, the strand insulation material, the winding insulation material, the thickness of the strand insulation 116, the thickness of the winding insulation 116, curvature of the end winding 104, and a length of the end winding 104. Strand 110 failure locations may differ between different windings having different characteristics. Stator characteristics may be manufacture dependent.

Selecting the inspection area may include a vibration analysis. When the inspection area is selected in such a manner, an area of higher stress may be determined. A need for a combined image of the end winding 104 may be eliminated by such a selection of the inspection area. Eliminating the need to reposition the radiation source 322 and the image capture device 324 per image saves time. Additional time is saved by not having to combine the multiple images.

The distance between the radiation source 322 and the object to be inspected, the end winding 104, is close. In an embodiment the source 322 is less than 50 mm from the object. In an embodiment, the maximum distance between the radiation source 322 and the object, is defined by the spacing between the end windings 104. Such a close distance is contrary to radiographic practice as a shorter distance is known to produce less clear images. The sharpness of the image is degraded at close distances between the radiation source 322 and the object. The degradation may be mitigated by using one or more of the stator characteristics and/or digital enhancement to interpret the image.

Figure 4:
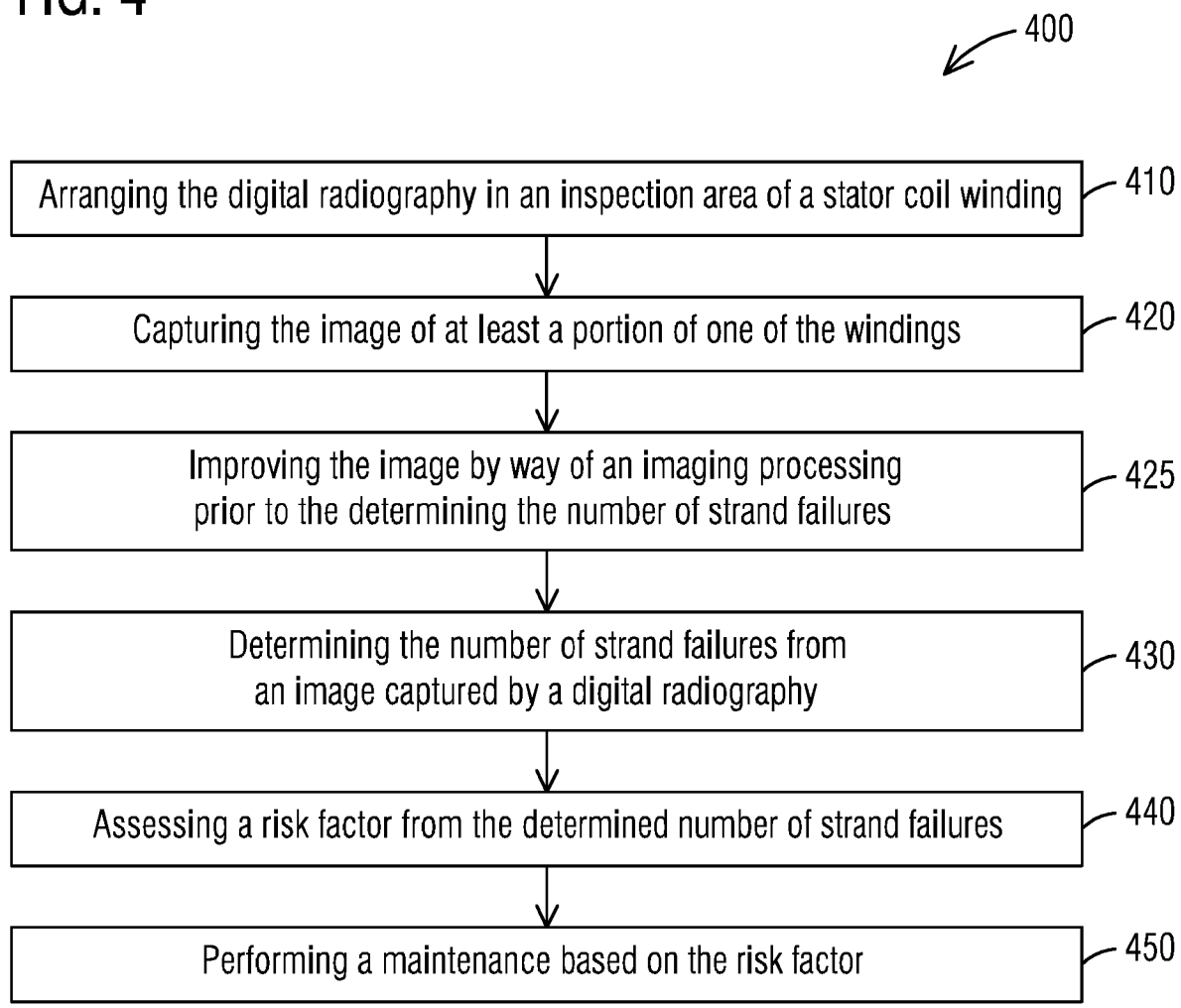
FIG. 4 illustrates a flow diagram of an example methodology that facilitates method of assessing the risk of a stator failure.

FIG. 4 illustrates a flow diagram of a method 400 of assessing the risk of a stator failure that facilitates one or more of the embodiments described herein. The method comprises determining the number of strand failures from an image, of at least a portion of a winding within an inspection area, captured by a radiography (430); and analyzing a risk of the stator failure from the determined number of strand failures and based on at least one stator characteristic (440). Whereby the risk analysis is performed based on the non-destructive testing results of capturing the image from the radiography 320 and from stator characteristics.

Prior to the determining, the method, according to an embodiment, comprises arranging the radiography in an inspection area of the winding 102 (410). For example, the radiation source 322 is arranged on one side of one of the plurality of windings 102 and the capture device 324 is arranged on an opposite side of the respective winding 102. The inspection area may be selected as described above regarding FIG. 3.

In an embodiment, the method, prior to the determining, comprises capturing the image of at least a portion of one of the windings 102 (420). The image comprises at least a portion of one of the plurality of windings 102 within the inspection area. For example, the image comprises a representation of at least a portion of an end winding 104. The number failures in the winding 102 may be determined from the image. The determining may consider stator characteristics to better interpret the image. For example, the dimensions of the layout of the strands 110 in the winding 102 and their dimensions may be used to identify individual strands and failures and thereby assist in an interpretation of the image.

In an embodiment, the method comprises improving the image by way of a digital enhancement prior to the determining the number of strand failures (425). The digital enhancement facilitates improving the image to make the features, especially the faults, easier to recognize. The digital enhancement may use the stator characteristics to identify edges of the strand and thereby improve the quality of the image.

In an embodiment, the image captures a portion of the entire width of an end winding 104. Consequently, not all the strands 110 in the end winding are captured in the image. For example, a limitation of the size of radiation source 322 and/or the image capture device 324 may prevent the image to capture the entire width. It is possible to take multiple images of the end winding 104, repositioning the radiation source 322 and the image capture device 324 per image, to produce a combined image of the end winding 104.

Replacing a winding may occur based simply on detecting a failure of a strand in the respective winding. This approach ignores that the winding may still properly function for a duration of time. By providing a risk analysis, the life of the winding may be extended.

The risk analysis may include comparing the number of strand 110 failures in a winding to a replacement threshold. Based on the risk analysis, a winding may be replaced, repaired, or monitored. A higher number of strand 110 failures within a winding 102 may cause the stator to malfunction and/or may be difficult to repair the winding and/or the repair is near or above the cost of a replacement. Characteristics of the stator may differ based on the manufacture. For example, the number of strands 110 in a winding 102 may be different per manufacture and therefore the replacement threshold could be different. The replacement threshold may be interpreted as a percentage of the number of strand failures to the number of strands 110 in one of the plurality of windings 102. In one embodiment, the replacement threshold percent is 5%; in another 2%; and another 1%. In an embodiment, in response to the number of strand 110 failures in a winding being at or above the replacement threshold, the winding 102 is replaced.

When the number of strand 110 failures in a winding is below a replacement threshold, the winding 102 may still function for a duration of time and the winding 102 may be repaired or monitored. A winding 102 may be repaired, in contrast to replacing the winding 102. Repairing the winding 102 comprises replacing one or more failed strands. According to an embodiment, in response to the number of strand 110 failures in a winding being below the replacement threshold, the winding 102 is repaired by replacing the failed strands. Monitoring the winding 102 allows for a postponement of a repair or replacement of the winding. According to an embodiment, in response to the number of strand 110 failures in a winding being below the replacement threshold, the winding 102 is monitored.

The risk analysis may include determining which of the failed strands in the winding 102 meets a location condition. A location condition is a condition when a repair may be less desirable. For example, a location condition may be one or more of the following conditions: strand failures are not adjacent to one another; strand failure is away or substantially away from the exterior of the winding 102; strand failure is in the outer section 103. According to an embodiment, in response to at least one of the strands 110 failure in the winding meeting the location condition, the winding 102 is replaced. According to an embodiment, in response to at least one of the strands 110 failure in the winding meeting the location condition, the winding 102 is monitored.

Monitoring may occur at subsequent planned outage or during operation of the generator. The monitoring may include repeating capturing the image of the winding 102 to obtain a subsequent image. The image and subsequent image may be compared to monitor crack growth. Based on the crack growth the winding 102 may be repaired or replaced. A risk analysis may be repeated from the subsequent image to determine if the winding will be repaired or replaced.

Multiple windings 102 may have one or more failures. If the number of windings 102 with failures is above a winding threshold, it may be desirable to replace each of the windings 102 with failures or even rewind the stator by replacing each of the windings 102. The risk analysis may include comparing the number of windings 102 with at least strand 110 failure to a winding threshold. The winding threshold may be a percentage of the windings with failed strands 110. In an embodiment, the winding threshold is 5%. In another embodiment, the winding threshold is 10%. In an embodiment, in response to the number of windings 102 with at least one strand 110 failure exceeding the winding threshold, at least the windings 102 with the at least one determined strand 110 failure is. In an embodiment, in response to the number of windings 102 with at least one strand 110 failure exceeding the winding threshold, the stator is rewound.

The risk analysis may include a stator examination, where the examination may include one or more of a visual inspection, frequency-response analysis and vibration analysis. A visual inspection may detect failures undetected by the image and/or potential areas that could lead to a failure. The frequency-response analysis, also referred to as a bump test, may detect a generator that is out of tune. In response to the generator being out of tune, the maintenance procedure comprises tuning the generator. For example, the tuning may be applying a damping to the windings 102. The risk analysis may include a vibration analysis along with the stator characteristics to determine a length of time before an examination is repeated or performing a repair or replacement. A delay of performing a repair or replacement may benefit the owner of the generator. Benefits may include one or more of deferring expense of replacement parts, scheduling down time to have least impact on loss of power generation which may lead to a loss of revenue, and planning a length of down time may be based on the number of replacements.

Once a strand fails, the failure will tend to propagate to additional strands over time. While the number of strand failures may be below any threshold triggering a maintenance of a repair or replacement, the triggering threshold could be reached over time. The risk analysis may include predicting when the triggering threshold will be reached. Predicting when the triggering threshold will be reached facilitates a postponement of replacing at least one of the windings. In an embodiment, the predicting may be based on one or more stator characteristics. In another embodiment, the predicting may be based on one or more operational conditions of the generator. For example, operational conditions may include vibrational forces, operation time, thermal conditions, and operational history of the generator. In another embodiment, the predicting is based on one or more stator characteristics and one or more operational conditions.

An embodiment includes performing a maintenance based on the risk analysis (450). The maintenance may include one or more of a repair, replacement, or tuning as described above.

The risk analysis is assessed based on one or more non-destructive tests as described above. Based on the analysis, a quantifiable determination of stator strand failures may be achieved. An earlier detection and more accurate detection may be achieved with the method described above. Thereby, any need for maintenance, what maintenance, and when the maintenance is performed may be more precisely determined by the risk analysis described above than with the previously known methods.

As used herein, the terms "component" and "system" are intended to encompass hardware, software, or a combination of hardware and software. Thus, for example, a system or component may be a process, a process executing on a processor, or a processor. Additionally, a component or system may be localized on a single device or distributed across several devices.

Also, it should be understood that the words or phrases used herein should be construed broadly, unless expressly limited in some examples. For example, the terms "include" and "comprise," as well as derivatives thereof, mean inclusion without limitation. The singular forms "a", "an" and "the" are intended to include the plural forms as well, unless the context clearly indicates otherwise. Further, the term "and/or" as used herein refers to and encompasses any and all possible combinations of one or more of the associated listed items. The term "or" is inclusive, meaning and/or, unless the context clearly indicates otherwise. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

Also, although the terms "first", "second", "third" and so forth may be used herein to refer to various elements, information, functions, or acts, these elements, information, functions, or acts should not be limited by these terms. Rather these numeral adjectives are used to distinguish different elements, information, functions or acts from each other. For example, a first element, information, function, or act could be termed a second element, information, function, or act, and, similarly, a second element, information, function, or act could be termed a first element, information, function, or act, without departing from the scope of the present disclosure.

In addition, the term "adjacent to" may mean: that an element is relatively near to but not in contact with a further element; or that the element is in contact with the further portion, unless the context clearly indicates otherwise. Further, the phrase "based on" is intended to mean "based, at least in part, on" unless explicitly stated otherwise.

Although an exemplary embodiment of the present disclosure has been described in detail, those skilled in the art will understand that various changes, substitutions, variations, and improvements disclosed herein may be made without departing from the spirit and scope of the disclosure in its broadest form.

None of the description in the present application should be read as implying that any particular element, step, act, or function is an essential element, which must be included in the claim scope: the scope of patented subject matter is defined only by the allowed claims. Moreover, none of these claims are intended to invoke a means plus function claim construction unless the exact words "means for" are followed by a participle.

What is claimed is:

1. A method of determining the risk of a stator failure, the stator comprising a plurality of stator coil windings, the plurality of windings comprising a first winding, each of the windings comprising a plurality of conductive metal strands, the method comprising:
    determining the number of strand failures in the first winding, from an image of at least a portion of the first winding within an inspection area, captured by a radiography; and
    analyzing a risk of the stator failure from the determined number of strand failures and based on at least one stator characteristic,
    wherein the risk analysis comprises comparing the number of strand failures in the first winding to a replacement threshold,
    wherein the risk analysis comprises determining at least one of the strand failures in the first winding meeting a location condition, the first winding is repaired by replacing the failed strands, wherein the location condition is selected from the condition consisting of failed strands are not adjacent to one another, strand failure is away or substantially away from the exterior of the winding, and strand failure is in the outer section,
    whereby the risk analysis is performed based on non-destructive testing results of capturing the image from the radiography and from stator characteristics.

2. The method according to claim 1,
    wherein the inspection area is selected based on a stator characteristic of the stator.

3. The method according to claim 1,
    wherein the selection of the inspection area includes vibrational analysis.

4. The method according to claim 1,
    wherein the image is captured from a radiation source being arranged on one side of the first winding and the capture device being arranged on an opposite side of the first winding.

5. The method according to claim 1,
    wherein the risk analysis includes at least one stator examination selected from the group consisting of visual inspection, frequency-response analysis and vibration analysis.

6. The method according to claim 5, comprising
    tuning the winding after performing the frequency-response analysis.

7. The method according to claim 1,
    wherein stator characteristics comprise one or more properties selected from the group consisting of strand material, dimensions of the strand, layout of the strands in the winding, number of strands in the winding, strand insulation material, winding insulation material, thickness of the strand insulation, thickness of the winding insulation, curvature data of the end winding, and length of the end winding.

8. A method of determining the risk of a stator failure, the stator comprising a plurality of stator coil windings, the plurality of windings comprising a first winding, each of the windings comprising a plurality of conducive metal strand, the method comprising:
    determining the number of strand failures in the first winding, from an image of at least a portion of the first winding within an inspection area, captured by a radiography; and
    analyzing a risk of the stator failure from the determined number of strand failures and based on at least one stator characteristic, wherein the risk analysis comprises determining at least one of the strand failures in the first winding meeting a location condition, the first winding is monitored, and wherein the location condition is selected from the condition consisting of failed strands are not adjacent to one another, strand failure is away or substantially away from the exterior of the winding, and strand failure is in the outer section,
    whereby the risk analysis is performed based on non-destructive testing results of capturing the image from the radiography and from stator characteristics.

9. The method according to claim 8,
    wherein the inspection area is selected based on a stator characteristic of the stator.

10. The method according to claim 8,
    wherein the selection of the inspection area includes vibrational analysis.

11. The method according to claim 8,
    wherein the image is captured from a radiation source being arranged on one side of the first winding and the capture device being arranged on an opposite side of the first winding.

12. The method according to claim 8,
wherein the risk analysis includes at least one stator examination selected from the group consisting of visual inspection, frequency-response analysis and vibration analysis.

13. The method according to claim 8,
wherein stator characteristics comprise one or more properties selected from the group consisting of strand material, dimensions of the strand, layout of the strands in the winding, number of strands in the winding, strand insulation material, winding insulation material, thickness of the strand insulation, thickness of the winding insulation, curvature data of the end winding, and length of the end winding.

14. A method of determining the risk of a stator failure, the stator comprising a plurality of stator coil windings, the plurality of windings comprising a first winding, each of the windings comprising a plurality of conductive metal strands, the method comprising:
   determining the number of strand failures in the first winding from an image of at least a portion of the first winding within an inspection area, captured by a radiography; and
   analyzing a risk of the stator failure from the determined number of strand failures and based on at least one stator characteristic, wherein the risk analysis comprises comparing the number of windings with at least one strand failure to a winding threshold,
   rewinding the stator in response to the number of windings with at least one strand failure being above the winding threshold,
   whereby the risk analysis is performed based on non-destructive testing results of capturing the image from the radiography and from stator characteristics.

15. The method according to claim 14,
wherein the inspection area is selected based on a stator characteristic of the stator.

16. The method according to claim 14,
wherein the selection of the inspection area includes vibrational analysis.

17. The method according to claim 14,
wherein the image is captured from a radiation source being arranged on one side of the first winding and the capture device being arranged on an opposite side of the first winding.

18. The method according to claim 14,
wherein the risk analysis includes at least one stator examination selected from the group consisting of visual inspection, frequency-response analysis and vibration analysis.

19. The method according to claim 18, comprising
tuning the winding after performing the frequency-response analysis.

20. The method according to claim 14,
wherein stator characteristics comprise one or more properties selected from the group consisting of strand material, dimensions of the strand, layout of the strands in the winding, number of strands in the winding, strand insulation material, winding insulation material, thickness of the strand insulation, thickness of the winding insulation, curvature data of the end winding, and length of the end winding.

\* \* \* \* \*